APPARATUS FOR INSTALLING COMPONENTS

Filed May 24, 1957

5 Sheets-Sheet 1

INVENTOR
CARL DINGELSTEDT
BY
R. V. Craddock
ATTORNEY

May 9, 1961 C. DINGELSTEDT 2,982,967

APPARATUS FOR INSTALLING COMPONENTS

Filed May 24, 1957 5 Sheets-Sheet 2

INVENTOR
CARL DINGELSTEDT
BY
R. V. Craddock
ATTORNEY

APPARATUS FOR INSTALLING COMPONENTS

Filed May 24, 1957

INVENTOR
CARL DINGELSTEDT
BY
[signature]
ATTORNEY

INVENTOR
CARL DINGELSTEDT
BY
R. V. Craddock
ATTORNEY

May 9, 1961 C. DINGELSTEDT 2,982,967

APPARATUS FOR INSTALLING COMPONENTS

Filed May 24, 1957

5 Sheets-Sheet 5

INVENTOR

CARL DINGELSTEDT

BY

C. V. Craddock

ATTORNEY

United States Patent Office 2,982,967

Patented May 9, 1961

2,982,967

APPARATUS FOR INSTALLING COMPONENTS

Carl Dingelstedt, Huntington, N.Y., assignor to Sperry Rand Corporation, Great Neck, N.Y., a corporation of Delaware Filed May 24, 1957, Ser. No. 661,318

3 Claims. (Cl. 1—323)

This invention relates to machines for installing components, and more particularly to apparatus for inserting and securing articles having a pair of leads to a printed circuit wiring board or other chassis.

In the development of apparatus, particularly electronic apparatus, in recent years, increasing attention has been given to the arrangement, size and adaptability to mass production methods of such apparatus. The development of printed circuitry is concerned with this trend and the purpose of the present invention is to provide methods and means for inserting the leads of electronic components into and through printed circuit wiring boards and securing the components to the boards. While the invention is described in its preferred embodiment with respect to the securing of electronic components to printed circuit wiring boards, it will be appreciated that this invention is not limited to electronic components but is applicable to installing other elements to any suitable chassis.

An object of the present invention is to provide an improved means for securing articles to a chassis.

Another object of the present invention is to provide an improved apparatus for securing a component to a chassis that is versatile and easily adjustable to adapt to various conditions and sizes.

A further object of the present invention is to provide an improved apparatus for securing a component to a chassis with minimum damage to the component and the chassis.

An additional object of the present invention is to provide an improved apparatus for securing components to a chassis where the component is installed in an off-centered condition.

These and other objects of the present invention are achieved by a machine for securing to a chassis an article having a pair of leads to be inserted therethrough comprising a frame having a head positionably mounted thereon which is axially reciprocable for cyclically conveying, selecting, forming and inserting the leads of successive components through predetermined portions of the chassis to protrude therefrom. On the other side of the chassis, cutting and securing means are mounted in close proximity to align with the protruding leads for severing a portion of the leads and securing the components to the chassis. Means are included for operating the elements in time relation. Manually operable means are also included for adjusting the apparatus to adapt to various component sizes and various centerline to center line conditions, as well as for regulating the amount of pressure on the component leads.

The above and other objects will become apparent from a description of a preferred embodiment of the invention with reference to the accompanying drawings, wherein like reference characters indicate like elements, in which Fig. 1 is a side view of a preferred embodiment of the present invention, partly in section;

Figures 1, 14:
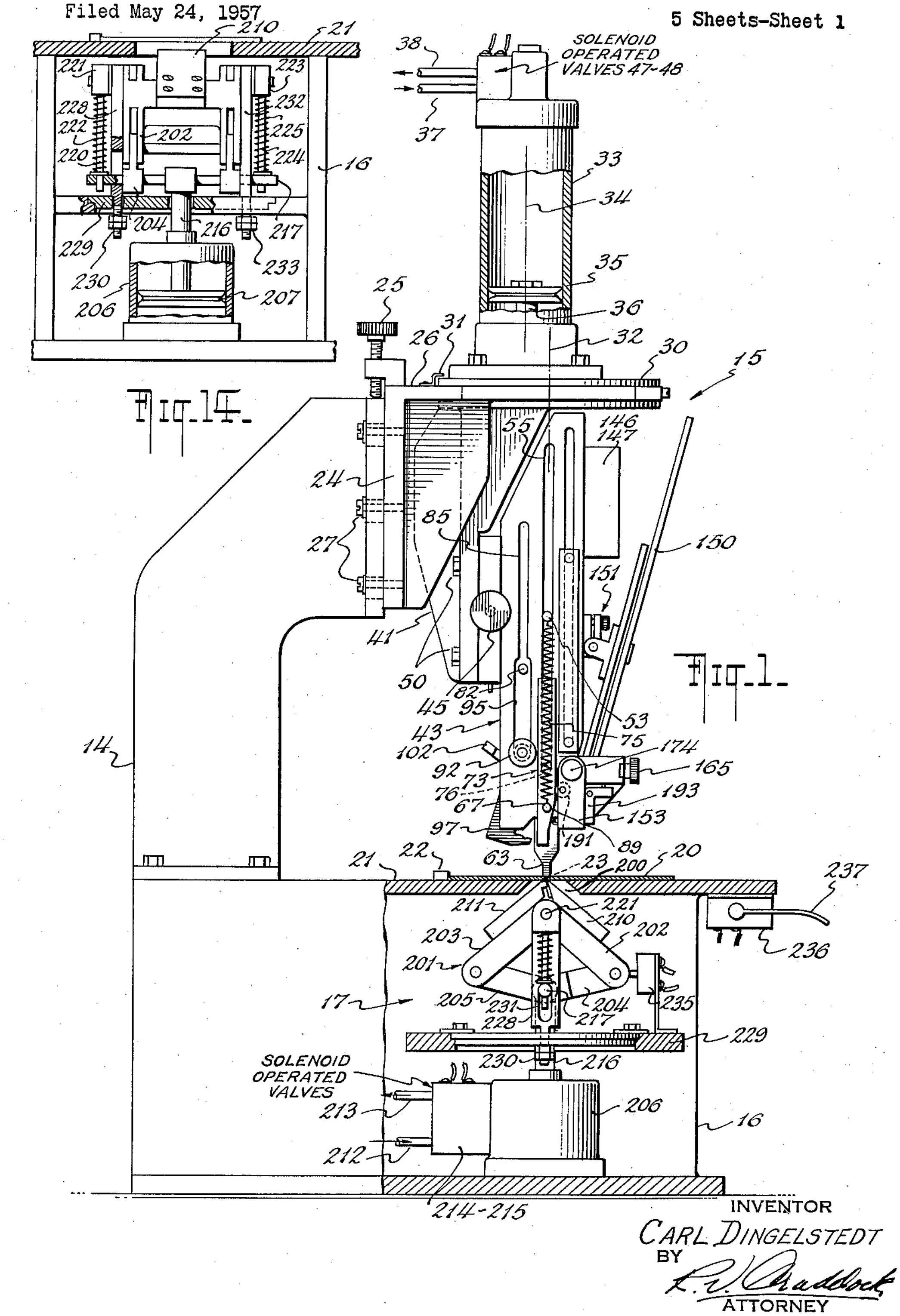
Figures 2, 3:
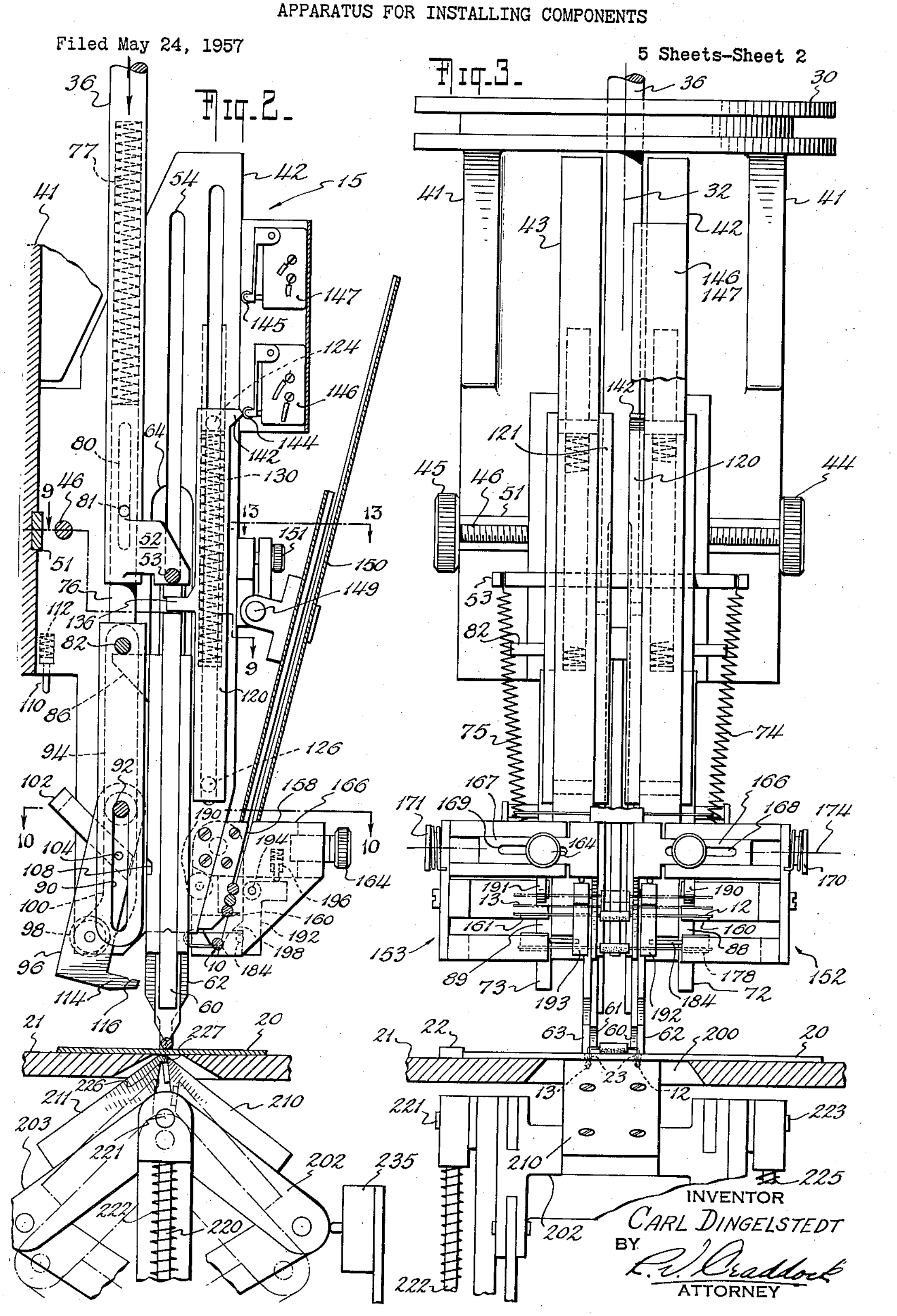
Fig. 2 is a vertical interior view of a portion of the invention shown in Fig. 1, partly in section, showing the apparatus in its maximum downward condition.
Fig. 3 is a front elevational view, partly in section, of the portion of the invention shown in Fig. 2.
Figure 4:
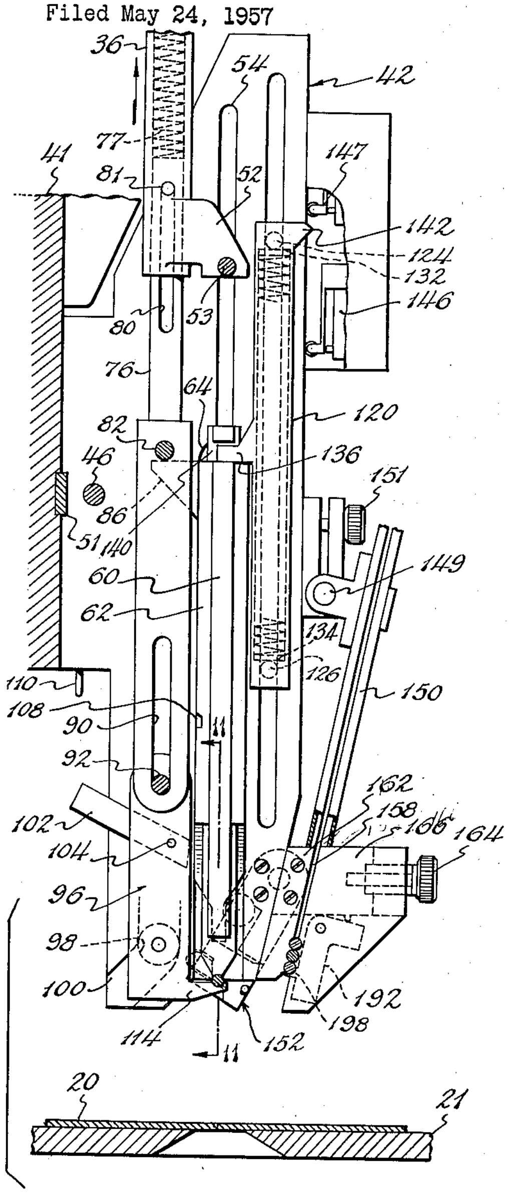
Fig. 4 is a vertical interior view, similar to Fig. 2, showing the insertion head of the present invention being positioned upwardly.
Figure 6:
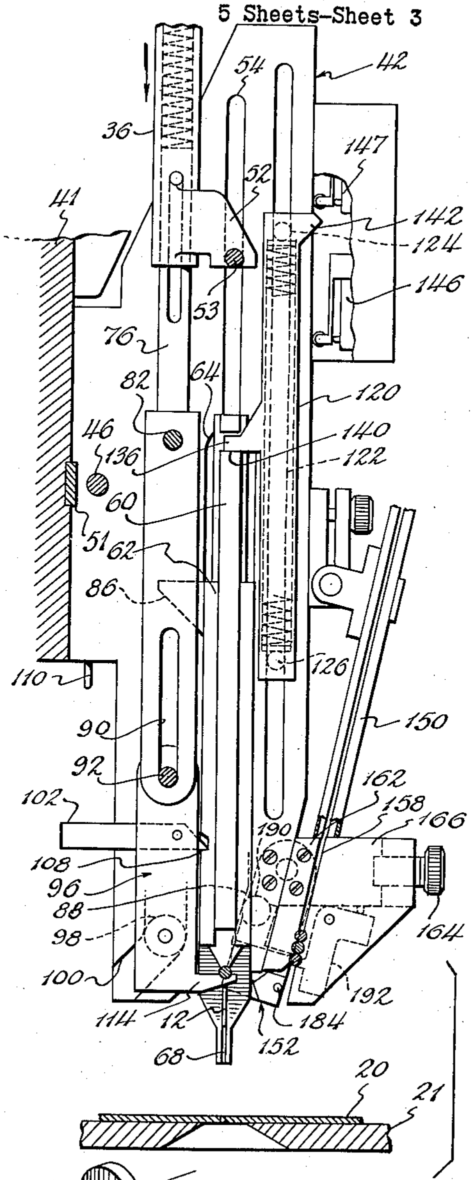
Figure 7:
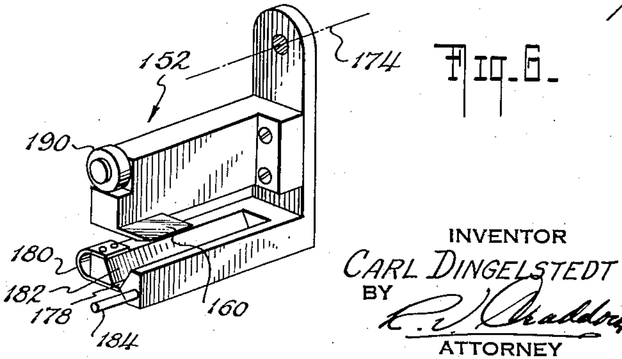
Figures 5, 8:
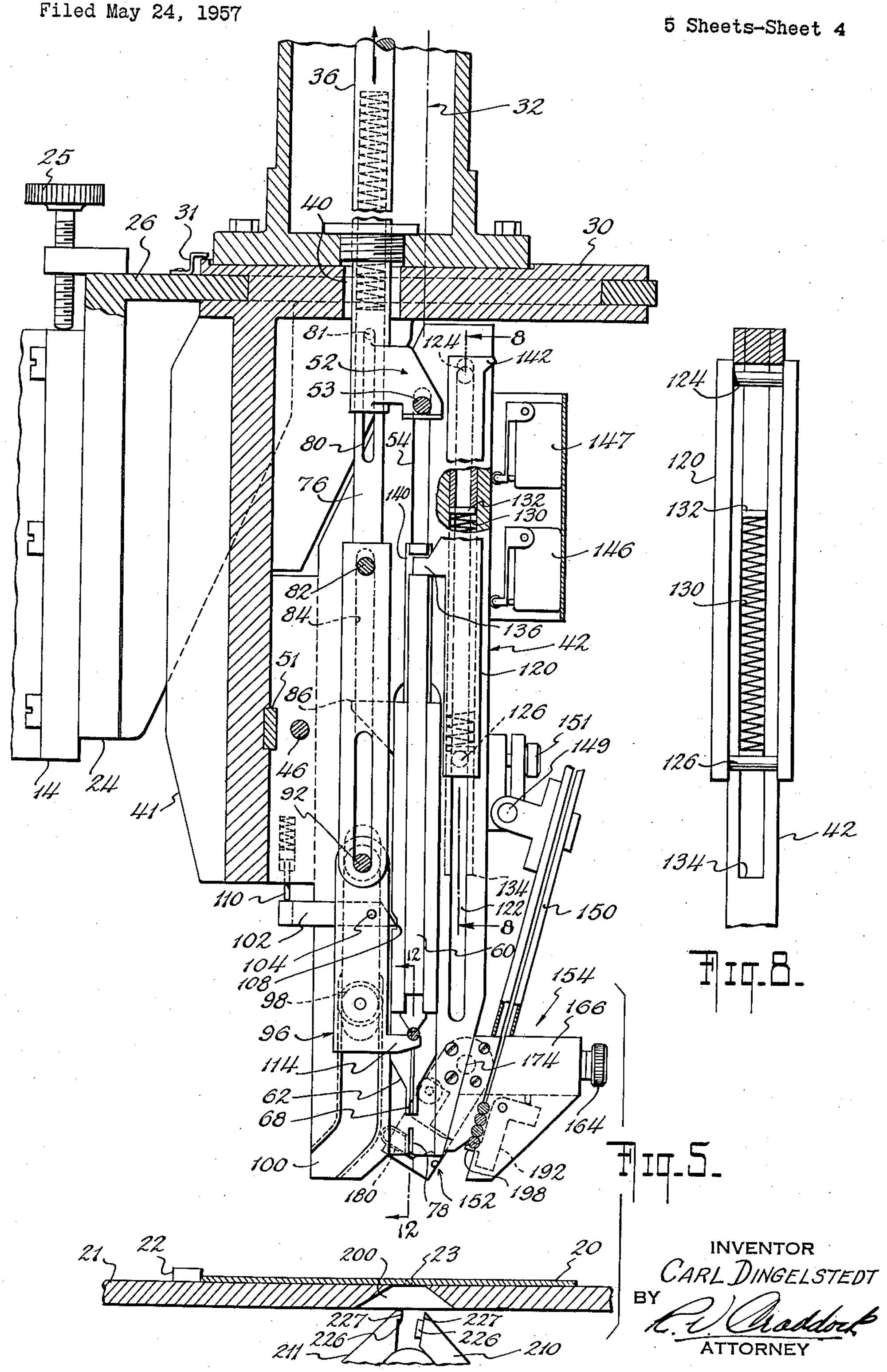
Figures 9, 10, 11, 12, 13:
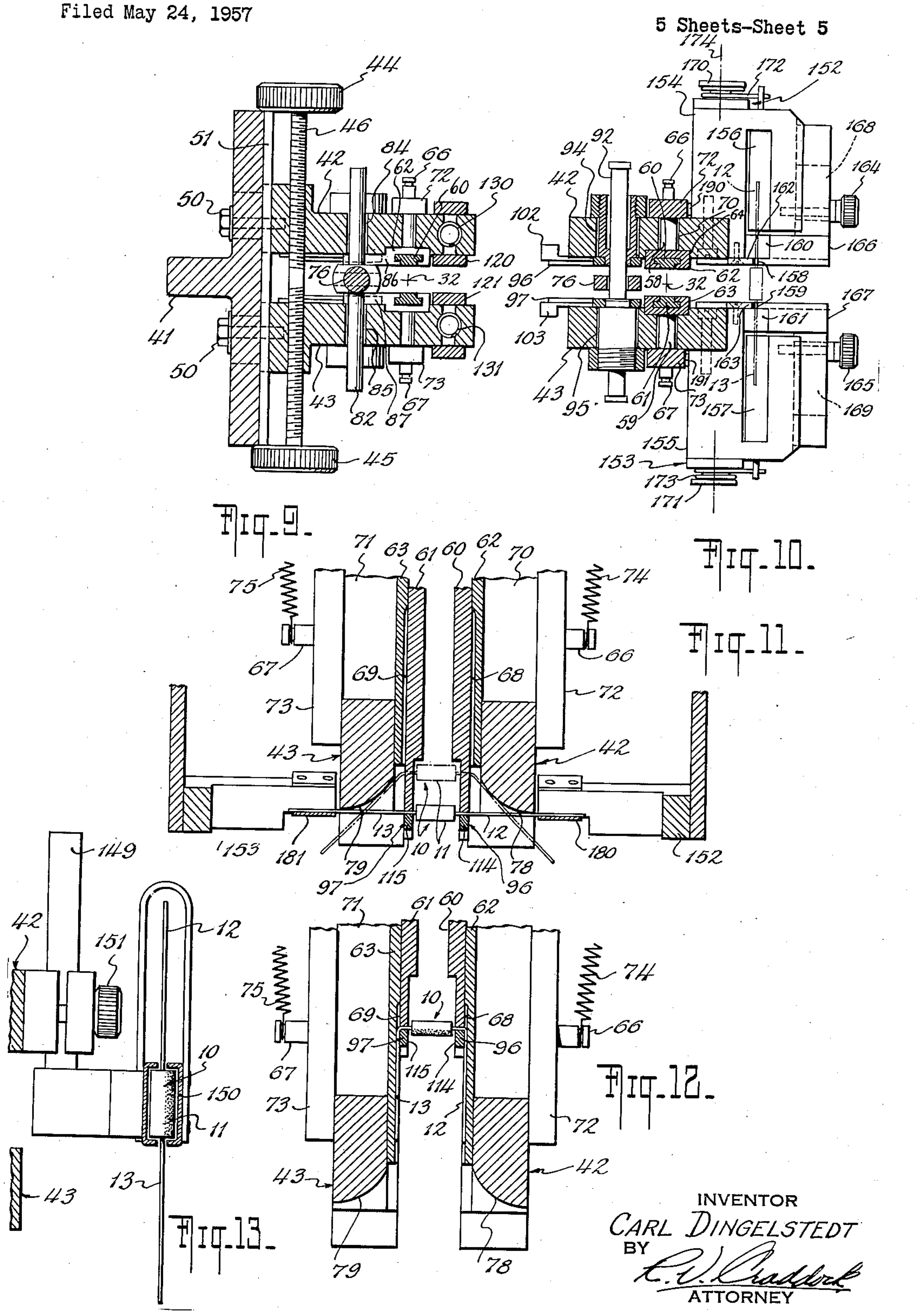

Fg. 5 is a vertical interior view, partly in section, showing the insertion head of the present invention in its maximum upward position;

Fig. 6 is a vertical interior view, similar to Fig. 4, showing the insertion head being positioned downwardly;

Fig. 7 is a perspective detailed view of a preferred embodiment of a shuttle of the present invention;

Fig. 8 is a sectional view, taken along the line 8—8 of Fig. 5, showing a detail of the pressure spring rod and bungee spring of the present invention;

Fig. 9 is a sectional view taken along line 9—9 of Fig. 2;

Fig. 10 is a sectional view taken along line 10—10 of Fig. 2;

Fig. 11 is a sectional view taken along line 11—11 of Fig. 4 showing the details of the lower extremities of the insertion head and the forming process;

Fig. 12 is a sectional view similar to Fig. 11 taken along line 12—12 of Fig. 5 of the lower extremities of the insertion head at a later stage in the forming process;

Fig. 13 is an enlarged section taken along line 13—13 of Fig. 2 showing the adjusting means for the component chute; and Fig. 14 is a detailed front elevational view of the cutting and securing mechanism with the toggle device in its lowest position.

For purposes of illustration, the present invention will be described with reference to a coaxial lead type component 10, as shown in Fig. 13, having a body 11, with leads 12 and 13 extending oppositely and coaxially therefrom that is inserted into a chassis 20 such as a printed circuit wiring board.

Referring now to Fig. 1, the preferred embodiment of the illustrated component installing machine includes a main frame 14 adjustably supporting an insertion head 15 having a lead conveying, selecting, forming and inserting mechanism therein to be described. Positionably housed in the base 16 of the frame 14 is a mechanism 17 to be described for cutting and securing the leads 12, 13 of the components 10. The wiring board 20 may be positioned by any suitable means between the head 15 and the lead cutting and securing mechanism 17 in readiness to receive the leads 12, 13 therethrough. The wiring board 20 may be positioned on the table 21 either manually or by means of a conveyor and associated positioning means. Assuming manual operation, the wiring board 20 is detachably mounted on the table 21 and aligned by means of a suitable fixture 22 such that the lead-receiving holes 23 in the wiring board 20 are aligned to receive the leads 12, 13 of the component 10.

For vertically positioning the insertion head 15 to adjust for variation in the diameter of the different sized components and for varying thicknesses of the wiring boards, the insertion head 15 is mounted upon bracket 24 which is vertically adjustable relative to the frame 14 by adjusting knob 25. Knob 25 also regulates the amount of pressure holding the component leads 12, 13 against the wiring board 20. After adjusting knob 25, bracket 24 is secured to frame 14 by tightening screws 27 that ride in suitable slots in the frame 14. The upper portion of the bracket 24 has a horizontal semi-circular shaped extension 26 having a circular hole therein that is adapted to receive a peripherally grooved circular plate 30, more clearly seen in Figs. 3 and 5. The circular plate 30 is manually rotatable relative to the extension 26. The upper portion of circular plate 30 may be inscribed with suitable indexing markings (not shown) for cooperation with fixed index 31. The circular plate 30 is concentric with the vertical indexing axis 32 of the insertion head 15.

Upper air cylinder 33 is fixedly mounted to the upper portion of circular plate 30 with the centerline 34 of the cylinder 33 parallel to the indexing axis 32. Upper air cylinder 33 is double-acting and connected to suitable high pressure and exhaust conduits 37 and 38 via solenoid operating valves 47 and 48. Slidably disposed for vertical reciprocable positioning within cylinder 33 is a piston 35 having a piston rod 36 extending exteriorly of the cylinder 33 and downwardly as viewed in Fig. 5 through an opening 40 in the plate 30.

Rigidly connected to the lower portion of the circular plate 30, or integral therewith, as shown, is a vertically disposed support member 41, more clearly seen in Fig. 5. Referring now to Figs. 3, 5 and 9, vertically disposed mounting brackets 42 and 43 are positionably secured to support member 41, one on each side of indexing axis 32 and equidistant therefrom. Adjusting knobs 44 and 45 are connected to a right hand-left hand threaded screw 46 that is threadedly connected to mounting brackets 42, 43 for simultaneously horizontally positioning the brackets 42, 43 in opposite directions relative to support member 41. Adjustment of knobs 44, 45 adapts the insertion head 15 to variations in component sizes and/or to variations in wiring board centerline to centerline conditions by increasing or decreasing the distance between the brackets 42, 43 while maintaining them equidistant from the indexing axis 32. After adjusting the knobs 44, 45, brackets 42, 43 are secured to support member 41 by tightening screws 50 that ride in suitable slots in the support member 41. To maintain vertical alignment of the brackets 42, 43 relative to support member 41, the brackets 42, 43 are horizontally slidable upon key 51 mounted in support member 41.

Referring now to Fig. 2, which shows a vertical interior view of a portion of the right side of the apparatus, particularly the insertion head 15, the elements therein will be described, it being understood that the left side of the insertion head 15 generally contains similar elements diametrically opposed to those described with respect to Fig. 2 as shown in Fig. 3. The lower extremity of the piston rod 36, which extends downwardly and exteriorly of the upper air cylinder 33 (shown in Fig. 1) has a projecting arm 52 extending perpendicularly therefrom. The arm 52 has a horizontally disposed pin 53 connected therethrough. The extremities of pin 53 extend through vertical slots 54 and 55 in brackets 42 and 43, respectively. Pin 53 cooperates with the upper extremity of the pressure slide 60. The pressure slide 60 is vertically positionable within a vertical T-shaped guide located in the wire guide member 62. The guide member 62, in turn, is vertically positionable in vertical slot 64 recessed into the bracket 42. As shown more clearly in Figs. 1, 3 and 10, cam plate 72 is connected to guide member 62 and positionable therewith by pin 58 that projects through vertical slot 70 in bracket 42. Cam plate 72 has a cam surface 88 thereon with pin 66 connected to cam plate 72 near the lower extremity thereof which can be seen more clearly with respect to Fig. 1 where cam plate 73 has a cam surface 89 thereon with pin 67 connected to cam plate 73 near the lower extremity thereof.

A spring 74 is connected between the extremities of pin 66 and pin 53 and, as seen more clearly in Fig. 1 where spring 75 is shown connected between the extremities of pins 67 and 53, to resiliently urge the guide members 62 and 63, respectively, in an upward direction as viewed in the drawing. As shown more clearly in Figs. 6, 11 and 12, the lower extremities of each of the guide members 62 and 63 has a vertical lead-receiving groove 68 and 69, respectively, therein adapted to guide leads 12 and 13. Cooperating with the grooves 68 and 69 are lead-receiving forming anvils 78 and 79 that are disposed in the lower extremities of brackets 42 and 43, respectively, for forming leads 12 and 13 in a manner to be described.

The lower extremity of the piston rod 36, as viewed in Fig. 2, is bored to slidably receive the cylindrical upper extremity of a shaft 76. The shaft 76 is resiliently urged in a downward direction, as viewed in the drawing, by a spring 77 mounted within the hollow portion of the piston rod 36. Spring 77 should be stronger than springs 74 and 75 to overcome their tension during the downstroke to be described. A vertical slot 80 within the shaft 76, near the upper extremity thereof, cooperates with a pin 81 rigidly connected to piston rod 36 near the hollow extremity thereof to allow limited relative movement vertically between the shaft 76 and the piston rod 36. The central portion of the shaft 76 has a pin 82 rigidly connected therethrough. The extremities of pin 82 project through vertical slots 84 and 85 in brackets 42 and 43, respectively, as shown in Fig. 9. As shown in Fig. 2, pin 82 cooperates with an arm 86 extending perpendicularly from the upper extremity of the guide member 62 for vertically positioning the guide member 62. The lower portion of shaft 76 is flat and has a vertical lost motion slot 90 therein through which the center portion of pin 92 slides, as shown in Fig. 10.

Referring again to Fig. 10, the outwardly extending portions of pin 92 pivotally support the upper portions of forming fingers 96 and 97 which may be seen more clearly in Fig. 2 with reference to forming finger 96. The extremities of pin 92 project through vertical slots 94 and 95 in brackets 42 and 43, respectively, and the pin 92 is vertically positionable therein in accordance with the movement of shaft 76. A roller guide member 98, shown in Fig. 2, is rotatably coupled to the forming finger 96 near the lower extremity thereof. The roller guide 98 rides in an angled T-shaped slot 100 formed in the lower portion of bracket 42. Pivotally connected to the upper portion of forming finger 96 by pin 104 is a latch 102 that is positionable to cooperate with a notch 108 formed in the side wall of the guide member 62. The latch 102 is positionable with the forming finger 96 and in its uppermost position, the latch 102 is resiliently urged in a counterclockwise direction, as viewed in Fig. 2, by pin 110 and spring 112 mounted in bracket 42. The lower extremity of forming finger 96 has an arm 114 extending perpendicularly therefrom with a shallow V-shaped notch 116 for supporting the lead 12 of component 10 in a manner to be described later. The upper portion of arm 114 is adapted to cooperate with the lower extremity of pressure slide 60 to hold lead 12 securely therebetween in a manner to be described.

Since the extremities of pins 53, 82 and 92 must project through brackets 42 and 43, the length of pins 53, 82 and 92 is determined by the distance between the exterior sides of brackets 42 and 43 when the brackets are positioned by adjusting knobs 44 and 45 to their maximum outward position. The maximum opening between the brackets 42 and 43 is dependent upon the size of the largest component which the apparatus is expected to install.

As shown in Figs. 5 and 8, pressure spring rod 120 is mounted for vertical positioning within vertical slot 122 in the mounting bracket 42 by means of upper and lower guide pins 124 and 126, respectively. The central portion of vertical slot 122 is drilled to a slightly larger diameter to slidably receive bungee spring 130. Bungee centralizing spring 130, in its fully extended position, extends between upper and lower shoulders 132 and 134, respectively, formed in bracket 42 to resiliently centralize pressure spring rod 120. As shown in Fig. 8, pin 126 is adapted to cooperate with, and slidably position, the lower extremity of spring 130 against the resilient force of spring 130, while pin 124 is similarly adapted to cooperate with the upper extremity of spring 130.

Pressure spring rod 120 has a centrally located arm 136, prependicularly extending therefrom, which is adapted to be received by a horizontal slot 140 in the upper portion of the pressure slide 60. Arm 136 is also adapted to cooperate with the upper extremity of the guide member 62 under certain conditions to be described later. As shown in Fig. 2, the upper extremity of the pressure spring rod 120 has a projecting cam 142 that cooperates with cam rollers 144 and 145 to actuate switches 146 and 147, respectively. The switches 146 and 147 are mounted on the bracket 42 for operation in a manner to be described.

Referring again to Fig. 2, also positionably attached to the mounting bracket 42, is a component chute 150 into which the components 10 are loaded. The chute 150 is horizontally positionable relative to bracket 42 by means of the adjusting knob 151 and adjusting shaft 149 that is connected to chute 150 as shown in Fig. 13. Preferably, the chute 150 is mounted at an angle to provide a gravity feed of the components 10 to shuttles 152 and 153. The components 10 are inserted into the chute 150 such that the body 11 of the component 10 is enclosed within the chute while the axial leads 12 and 13 of the components 10 extend through the slots on each side of the chute 150. As shown in Fig. 10, connected to each of the mounting brackets 42 and 43 near the lower extremities thereof and adapted to cooperate with the lower extremity of the chute 150 are brackets 154 and 155, respectively. Each bracket 154, 155 has a slot 156, 157, respectively, therein which is aligned with the slots on the lower extremity of the chute 150 such that the leads 12, 13 of the components 10 may pass by gravity feed from the chute 150 through the slots 156, 157 and particularly through slots 158 and 159 onto the shelves 160 and 161 of shuttles 152 and 153, respectively. As shown more clearly in Fig. 4, slot 158 is formed by the spaced relation of a portion of aligning member 166 with respect to plate 162 mounted on bracket 154. As seen in Fig. 10, slot 159 is similarly formed by the spaced relation of aligning member 167 with respect to plate 163.

Continuing to refer to Fig. 10, adjusting knobs 164 and 165 are provided for horizontally positioning the aligning members 166 and 167 by means of slots 168 and 169 therein (see also Fig. 3), respectively, with respect to brackets 154 and 155. By means of knobs 164, 165 and 151 (shown on Fig. 2) the lower extremity of the chute 150 may be aligned with members 166 and 167 to provide a means for adapting to variations in component sizes and also to provide a means for off-centering the components such that they may be adapted to various wiring board centerline to centerline conditions.

Shuttles 152 and 153 are pivotally mounted on brackets 154 and 155 by means of pivots 170 and 171, respectively. The shuttles 152, 153 are resiliently urged in a clockwise direction as viewed in the drawings by springs 172 and 173 to pivot about axis 174. As seen in Figs. 3 and 7, within each shuttle 152 and 153, a shelf 160, 161 is adapted to receive a lead 12, 13 of the components 10 as they slide down the chute 150. Located on the lower portion of the shuttle 152, as seen more clearly in Fig. 7, and disposed beneath shelf 160 is a second shelf or platform 178 that is also adapted to receive lead 12 in a manner to be described.

Platform 178 comprises a V-shaped notch 182 having a resilient base formed by flat spring 180. As shown in Fig. 11, the flat springs 180 and 181 of platforms 178 and 179, respectively, allow the leads 12 and 13 to snap out as the component 10 is drawn upward in a manner to be described. Referring again to Fig. 7, pin 184 extends from the lower portion of shuttle 152 and cooperates in a manner to be described with gate 192 (shown in Figs. 2 and 3). Cam roller 190 is rotatably connected to an upper portion of shuttle 152 for cooperation with the cam surface 88 on cam plate 72 of guide member 62 (shown more clearly in Fig. 1 with respect to cam surface 89 on cam plate 73 of guide member 63 and cam roller 191 on shuttle 153) for purposes to be described.

Referring to Figs. 2 and 3, a gate 192 in the form of a bell crank is pivotally mounted on aligning member 166 by pivot 194 and resiliently urged in a clockwise direction, as viewed in Fig. 2, by spring and plunger 196 mounted in member 166 acting downwardly on the upper arm of gate 192. Attached to the lower arm of the gate 192 is a third shelf or projection 198 adapted to receive the lead 12 of component 10 from shelf 160 of the shutle 152 when the shuttle 152 is in its most inward position, i.e., when rotated to its furthest clockwise position, as shown in Fig. 5, at which time the projection 198 is horizontally disposed with the gate 192 also in its furthest clockwise position.

When the gate 192 is urged in a counterclockwise direction by pin 184 on shuttle 152 acting on the lower arm of gate 192, the projection 198 is sloped downwardly, as shown in Fig. 2, thereby dropping the lead 12 of component 10 into the grooved lower platform 178 of the shuttle 152. This occurs when shuttle 152 is urged in a counterclockwise direction by the cam on cam plate 72 acting on the cam roller 190 that is rotatably mounted on the shuttle 152.

Although the insertion head mechanism of the preferred embodiment of the present invention has been described, primarily with respect to the elements mounted on bracket 42 only, it is to be understood that the insertion head mechanism includes diametrically opposed elements mounted on bracket 43 that are counterparts of the elements mounted on bracket 42. The elements mounted on bracket 43 are simultaneously actuated with the elements mounted on bracket 42 for cooperation therewith. The elements mounted on bracket 43 that are counterparts to those mounted on bracket 42 include pressure slide 61, wire guide member 63, forming finger 97, pressure spring rod 121, anvil 79, shuttle 153 and others as shown in the drawings. All the elements mounted on bracket 42 are duplicated with respect to bracket 43, except there is only one component chute 150, adjusting knob 151 and adjusting shaft 149; and switches 146 and 147 are not duplicated thereby making cam 142 unnecessary with respect to pressure spring rod 121.

Referring again to Fig. 1, the cutting and securing mechanism 17 located in the base 16 of the component insertion machine is adapted to receive the leads 12, 13 of the components 10 after they have been inserted through the lead-receiving holes 23 in the wiring board 20 and through opening 200 in table 21. Mechanism 17 includes a toggle device 201 having upper arms 202, 203 and lower arms 204, 205. Toggle device 201 is reciprocably actuated by a lower air cylinder 206 for positioning toggle 201 and for opening and closing the cutting and securing jaws 210, 211 that are mounted on the upper portion of toggle 201. Double-acting lower air cylinder 206 is connected to suitable high pressure and exhaust conduits 212 and 213 via solenoid operating valves 214 and 215. Solenoid operating valves 214 and 215 are electrically connected to switches 146 and 147, respectively, for actuation thereby in a manner to be described.

As shown in Fig. 14, the piston rod 216 extends exteriorly and upwardly from the lower air cylinder 206 and is connected to the lower pivot rod 217 of toggle 201 for vertically positioning toggle 201 and for opening and closing jaws 210 and 211. The upper extremity of a rod 220 is connected to upper pivot 221 while the lower extremity of the rod 220 slidably projects through an aperture in one extremity of pivot rod 217. Spring 222 is coaxial with and encircles rod 220 being disposed between upper pivot 221 and pivot rod 217 to resiliently urge pivot rod 217 in a downward direction as viewed in the drawing. Similarly disposed between upper pivot 223 and the other extremity of pivot rod 217 are rod 224 and spring 225 which also resiliently urge pivot rod 217 in a downward direction. Also connected to upper pivot 221 is a limit member 228, the lower extremity of which projects through platform 229 to threadedly receive adjusting nuts 230. Member 228 has a vertical lost motion slot 231 therein through which pivot rod 217 projects and is vertically positionable therein. Similarly, member 232 is connected to upper pivot 223 and has a lower extremity which extends through platform 229 to threadedly receive adjusting nuts 233. Member 232 also has a vertical lost motion slot therein through which pivot rod 217 extends. Platform 229 is rigidly connected to main frame 14. The height of the toggle 201 is adjustable for controlling the amount of rise of the jaws 210 and 211 by positioning the adjusting nuts 230 and 233 which abut against the underside of platform 229 to limit said rise. In its uppermost position toggle 201 is in close proximity to the underside of wiring board 20 and actuates the contact arm on switch 235 mounted on the platform 229. Switch 235 is electrically connected to solenoid valve 48 for actuation thereof in a manner to be described.

As shown more clearly in Fig. 2, the jaws 210 and 211 have upper extremities including a cutting portion 226 and a crushing portion 227 which first cut leads 12 and 13 of the components 10 by a shearing action of the jaws 210, 211 and then crush the remaining portion of the leads 12 and 13 that protrude through wiring board 20 between the upper extremities of jaws 210 and 211. The crushing action of the jaws 210, 211 flattens the remaining portions of leads 12 and 13 to provide spades thereon which secure the components 10 to the wiring board 20.

As shown in Fig. 1, mounted on the under side of table 21 is a starting switch 236 that is actuated by depressing lever 237. Switch 236 is electrically connected to solenoid valve 47 for actuation thereof in a manner to be described. Alternatively, switch 236 may be in the form of a microswitch mounted in fixture 22, for example, that actuates solenoid valve 47 when the wiring board 20 is suitably disposed with respect to fixture 22.

Referring now to the operation of the illustrated preferred embodiment of the component installing machine of the present invention, reference is made to Figs. 1, 2 and 3. For ease of description, the operation of the machine will be described starting at an interval in time after the lever 237 on starting switch 236 has been depressed thereby actuating solenoid valve 47 to introduce high pressure air to the upper side of piston 35 of upper air cylinder 33 to induce a downward movement of the piston 35 to its lowest position, as shown in Fig. 1.

In this position, the insertion head 15 is in its maximum downward position and the toggle 201 is in its maximum upward position with component 10 secured to the wiring board 20 by leads 12 and 13 extending through holes 23, said leads 12 and 13 having been cut and spaded. Piston rod 36 is in its lowest position, with pin 82 bearing on the arms 86, 87 of guide members 62, 63 and pin 53 bearing on the upper extremities of pressure slides 60, 61. In this position, the guide members 62, 63 have their lower extremities bearing on wiring board 20. The pressure slides 60, 61 are also at their lowest position with their lower extremities bearing on leads 12, 13, respectively, of component 10. The cam surfaces 88, 89 on cam plates 72, 73 bearing on cam roller 190, 191 have caused the shuttles 152, 153, respectively, to swing outwardly, i.e., counterclockwise, such that the shelves 160, 161 engage leads 12, 13, respectively, of the component 10 located at the bottom of the chute 150. Pins 184, 185 bearing on the lower arm of gates 192, 193, respectively, urge the gates 192, 193 in a counterclockwise direction thereby selectively dropping the component 10 previously held on projections 198, 199 down to platforms 178, 179 of the shuttles 152, 153.

The forming fingers 96, 97 have been positioned in a clockwise direction away from pressure slides 60, 61 by means of the lower guides 98, 99 sliding in slots 100, 101. The latches 102, 103 attached to the forming fingers 96, 97 have also been positioned in a clockwise direction so that they no longer engage guide members 62, 63.

The cam 142 has tripped switch 146 thereby actuating a solenoid valve 214 to introduce high pressure air to the lower portion and exhausting the upper portion of the lower air cylinder 206 which induces upward movement of piston 207 shown in Fig. 14. Continuing to refer to Fig. 14, as the piston 207 is induced in an upward direction, the jaws 210, 211 and toggle 201 are raised until the jaws 210, 211 are in close proximity to the underside of wiring board 20, at which time the adjusting nuts 230, 233 abut against the underside of platform 229, thereby preventing further upward movement of the jaws 210, 211. Piston 207 continues to move in an upward direction overcoming the restraining action of the relatively heavy springs 222, 225. As piston 207 continues to rise, the toggle arms 202, 203, 204, 205 extend outwardly thereby closing jaws 210, 211. As jaws 210, 211 close, leads 12, 13 are first cut to the desired length by cutting portion 226 and then the remaining portions of the leads 12, 13 projecting beneath the wiring board 20 are crushed between the jaws 210, 211 by crushing portion 227 to secure the component 10 to the wiring board 20 with a minimum of stress on the body 11 of component 10. The severed portions of leads 12, 13 drop downwardly to be collected in a hopper or blown by suitable air jets (not shown) into a disposal trough (not shown). In their outermost position, arms 202, 204 of toggle 201 trip switch 235 to initiate the next sequence of operations shown in Fig. 4.

Tripping the switch 235 actuates solenoid valve 48 introducing high pressure air to the lower portion of upper air cylinder 33 and exhausting the upper portion thereby inducing upward movement to piston 35. Fig. 4 indicates the position of the elements in this condition. As piston 35 moves upwardly, piston rod 36 also moves upwardly carrying with it shaft 76 by means of pin 81 abutting against the upper extremity of slot 80. Pins 53 and 82 are also positioned upwardly. With the pin 53 removed from the upper extremity of pressure slides 60, 61, bungee springs 130, 131 tend to center themselves between shoulders 132, 133 and 134, 135, respectively, thereby urging pressure slides 60, 61 in an upward direction until they are centralized in the position indicated in Fig. 4. Springs 74, 75 also urge the guide members 62, 63 upwardly following pin 82 until the limit of slot 64 is reached. As guide members 62, 63 are moved upwardly, springs 172, 173 urge shuttles 152, 153 clockwise such that cam rollers 190, 191 follow the contours of the cam surfaces 88, 89 on cam plates 72, 73 until the shuttles 152, 153 are in their furthest clockwise position as shown in Fig. 4. With the shuttles 152, 153 in their furthermost clockwise position as shown, the leads 12, 13 of component 10 on platforms 178, 179 are aligned with and directly below the lower extremities of pressure slides 60, 61.

The components 10, which were resting on shelves 160, 161 have been transferred to projections 198, 199 on gates 192, 193 that have been urged in a clockwise direction by springs and plungers 196, 197. Gates 192, 193 now support the component 10 previously located on shelves 160, 161, as well as all the other components 10 located in the chute 150.

After the component 10, located in platforms 178, 179, is positioned under the lower extremities of the pressure slides 60, 61, the forming fingers 96, 97 are urged upwardly, after a suitable time delay determined by lost motion slot 90, by shaft 76 acting through pin 92. As the forming fingers 96, 97 are positioned upwardly, roller guides 98, 99 in T-slots 100, 101 position the lower extremities of the forming fingers 96, 97 in a clockwise direction until notches 116, 117 are aligned below leads 12, 13. As shaft 76 continues upwardly, the notches 116, 117 in forming fingers 96, 97 engage leads 12, 13 thereby lifting component 10. As shown in Figs. 4 and 11, leads 12, 13 are now securely grasped between forming fingers 96, 97 and the lower extremities of pressure slides 60, 61. Continued upward travel of shaft 76 snaps the extremities of the leads 12, 13 out of springs 180, 181 of platforms 178, 179 and draws them past lead forming anvils 78, 79 as indicated by the dashed lines in Fig. 11 thereby forming the leads 12, 13 into a suitable shape, i.e. parallel. During the forming operations the component 10 is firmly secured by its leads 12, 13 between forming fingers 96, 97 and pressure slides 60, 61 to minimize damage to the body 11 and to prevent tearing the leads 12, 13 from the body 11 during forming of the leads 12, 13. During this stage of the operation, the leads 12, 13 are firmly held by the upward movement of forming fingers 96, 97 and the downward resilient force exerted on the pressure slides 60, 61 by bungee springs 130, 131 acting against pins 126, 127 of pressure spring rods 120, 121, which force is transmitted via arms 136, 137 to pressure slides 60, 61. The forming of the leads 12, 13 can be compared to the action of bending a cantilever structure. The leads 12, 13 are firmly clamped as shown in Fig. 11 and as described immediately above during the forming operation. The first bending force applied to the leads 12, 13 is applied by the edge of the anvils 78, 79 furthest away from the component body 11. The beginning of the forming action thus takes place at a distance many times the lead wire diameter away from the component body 11 and produces a natural bend of the lead wires 12, 13, resulting in minimum strain or pull on the junction of the lead wires 12, 13 to the component body 11.

Referring now to Figs. 5 and 12, as the insertion head mechanism continues to move upward, the leads 12, 13 are formed and drawn into lead-aligning grooves 68, 69 in guide members 62, 63 until the maximum upward position is reached as shown in the aforementioned figures with the leads 12, 13 entirely within grooves 68, 69. At this point, the outer portions of leads 12, 13 are perpendicularly disposed with respect to the longitudinal axis of component 10 and parallel to each other. Shaft 76 is now in its uppermost position thereby drawing forming fingers 96, 97 into their uppermost position, such that pins 110, 111 resiliently urge latches 102, 103 in a counterclockwise direction until the extremities thereof engage notches 108, 109 in guide members 62, 63. Cam 142 of pressure spring rod 120 now actuates switch 147 thereby actuating solenoid valve 215 to introduce high pressure air to the upper portion of the lower air cylinder 206 and exhausting the lower portion thus inducing movement of piston 207 in a downward direction. Downward movement of piston 207 opens jaws 210, 211 of toggle 201 and returns the toggle mechanism 201 to its lowest position as shown in Fig. 14. At this point, wiring board 20 is repositioned to insert another component 10 in a different pair of lead-receiving holes 23, or a different wiring board 20 is inserted with its lead-receiving holes 23 aligned to receive leads 12, 13.

At this point in the operation, it is the beginning of a new cycle which is initiated by depressing lever 237 of switch 236 thereby actuating solenoid valve 47 to introduce high pressure air to the upper side while exhausting the lower side of piston 35 of upper air cylinder 33, thereby inducing downward movement of piston 35, a portion of which has been previously described. Referring now to Figs. 6 and 12, as piston rod 36 moves downwardly, spring 77 urges shaft 76 downwardly. Bungee springs 130, 131, acting through pressure spring rods 120, 121 resiliently urge pressure slides

60, 61 downwardly thereby forcing forming fingers 96, 97 downwardly. Latches 102, 103, attached to forming fingers 96, 97, continue to engage guide members 62, 63 thereby moving said members 62, 63 downwardly until bungee springs 130, 131 are centered in the position as shown in Fig. 6. During this interim, leads 12, 13 have been securely held between pressure slides 60, 61 and forming fingers 96, 97. As shaft 76 continues downwardly, pin 92 rides in lost motion slot 90 until pin 92 abuts against upper extremity of slot 90 at which time pin 82 abuts against arms 86, 87 on guide members 62, 63. While pressure slides 60, 61 are maintained in equilibrium by bungee springs 130, 131, guide members 62, 63 via pin 82 and forming fingers 96, 97 via spring 92 are positioned downwardly. After this point, forming fingers 96, 97 are no longer needed and by action of the roller guides 98, 99 in T-slots 100, 101, the lower extremities of forming fingers 96, 97 slide away in a clockwise direction and no longer engage leads 12, 13.

By this means, latches 102, 103 are also disengaged from notches 108, 109. Simultaneously, via pin 82, guide members 62, 63 have been traveling downwardly until their lower extremities bear upon the upper surface of wiring board 20 with the groove 68, 69 of guide members 62, 63 aligned with holes 23 and the wiring board to thereby guide leads 12, 13 into holes 23.

Upon further downward motion of piston rod 36, pin 53 abuts against the upper extremity of pressure slides 60, 61, forcing them downwardly against the resilient force of bungee springs 130, 131 until the lower extremities of pressure slides 60, 61, which bear against leads 12, 13, force the leads as guided by grooves 68, 69 through the lead-receiving holes 23 in wiring board 20 with the insertion head in its lowest position, as viewed originally in Figs. 1, 2 and 3.

Referring again to Fig. 6, during the time that the guide members 62, 63 were being forced downwardly, the cam plates 72, 73 thereon acting against cam roller 190, 191 were forcing the shuttles 152, 153 in a counterclockwise direction. As the shuttles 152, 153 continue to move counterclockwise, shelves 160, 161 are selectively inserted between the leads 12, 13 of the component 10 resting on projection 198, 199 of gates 192, 193 and the leads 12, 13 of the component 10 directly above the previously mentioned selected component 10. Shelves 160, 161 then support all the components in the chute except the selected component resting on gates 192, 193. Further counterclockwise movement of shuttles 152, 153 pivots gates 192, 193 in a counterclockwise direction by means of pins 184, 185, thereby dropping the selected component 10 that had been resting on gates 192, 193 onto platforms 178, 179. The selected component 10 is then in position to go through the cycle of operation previously described.

It is obvious that many modifications could be made to the invention without departing from the spirit thereof, for example, actuation of the elements might be accomplished by electrical means in lieu of the pneumatic means illustrated. Further, depending upon the manner of locating the wiring board 20 on table 21, it might not be desirable to vertically position the cutting and securing mechanism 17. Since the reason for reciprocably positioning mechanism 17 is to avoid interference by the protruding spaded portions of leads 12, 13 when the wiring board 20 is relocated on or removed from table 21 with respect to the jaws 210, 211, depending upon the operation of jaws 210, 211 and the manner of positioning wiring board 20, the reciprocable positioning of mechanism 17 may be eliminated as long as the jaws 210, 211 are opened and closed in proper time relation.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. In a machine for securing to a chassis a component having a pair of generally coaxial oppositely extending leads to be inserted therethrough, a frame, a head rotatably and translatably positionable with respect to the frame, a first pair of first and second spaced brackets positionably disposed within said head, first adjusting means for simultaneously moving said first and second brackets for varying the spaced relation between said first and second brackets, component feeding means positionably mounted on said head, a second pair of third and fourth spaced brackets positionably disposed on said first and second brackets respectively, second adjusting means for varying the spaced relation between said third and fourth brackets for inserting the components in an off-center condition, said feeding means including a component chute positionably mounted on one of said first pair of brackets and adapted to be aligned with said second pair of brackets, and further including first and second diametrically opposed shuttles pivotally and resiliently mounted on said first and second brackets respectively and adapted to cooperate with said third and fourth brackets for receiving the leads of said components, said feeding means further including means for conveying one of said components, forming means mounted in said brackets for forming the leads of the conveyed component, said forming means including first and second diametrically opposed forming fingers positionably mounted on said first and second brackets respectively and adapted to receive the leads of the conveyed component from said shuttles, said forming means further including first and second diametrically lead forming anvils fixedly mounted in said first and second brackets respectively and cooperable with said forming fingers to engage outer portions of the leads of the conveyed component, guiding means positionably mounted in said brackets for guiding the leads of the conveyed component, said guiding means including first and second diametrically opposed guide members having lead aligning grooves therein positionably mounted on said first and second brackets and cooperable with said forming means, inserting means positionably mounted in said guiding means for inserting the leads of the conveyed component through predetermined portions of said chassis, said inserting means including first and second diametrically opposed pressure slides positionably mounted in said guiding means and adapted for cooperation with said conveying means, forming means and guiding means and a single reciprocating driving means for positioning all of the aforementioned first and second reciprocable elements and for simultaneously positioning each pair of said first and second reciprocable elements whereby during the forming operation the leads of the conveyed component are securely grasped between the forming fingers and the pressure slides at a predetermined distance from the body of the component to prevent damage to the body of the component and to avoid disengaging the leads from the body of the component.

2. In a machine for forming the leads of components having coaxial leads extending oppositely from their bodies and inserting the formed leads into lead receiving holes in a wiring board, a base for supporting said wiring board, a head mounted on said base, said head being rotatably and translatably positionable with respect to said wiring board, first and second supporting brackets adjustably mounted on said head, adjusting means for simultaneously moving said first and second brackets for varying the spaced relation between said brackets, component supplying means including first and second elements mounted on said first and second supporting brackets, respectively, for supplying successive components, lead grasping means having first and second grasping mechanisms reciprocably mounted on said first and second supporting brackets, respectively, for securely grasping the oppositely extending leads of successive components at first predetermined distances near the bodies of the respective components, said lead grasping means being cooperable with said component supply means, lead forming means including first and second anvils mounted on said first and second supporting brackets, respectively, and cooperable with said lead grasping means for forming the oppositely extending leads of successive components, said lead forming means being operable on the oppositely extending leads at second predetermined distances considerably spaced from said respective bodies for forming the outer portions of the leads while the inner portions thereof are securely grasped thereby preventing stress on the component body, said second predetermined distances being many times the lead diameter away from said respective bodies, and means reciprocable in said head and cooperative with said lead grasping means for moving said lead grasping means away from said wiring board whereby said leads are formed and for moving said lead grasping means toward said wiring board whereby the formed leads are inserted into said lead receiving holes.

3. In a machine of a character described in claim 2 including third and fourth spaced brackets positionably disposed on said first and second brackets respectively and additional adjusting means for varying the spaced relation between said third and fourth brackets for inserting the components in an off-center condition.

References Cited in the file of this patent

UNITED STATES PATENTS

| | | |
|---|---|---|
| 968,863 | Mackay | Aug. 30, 1910 |
| 1,859,951 | Blevney | May 24, 1932 |
| 1,982,743 | Kleinschmit | Dec. 4, 1934 |
| 2,758,303 | Dow | Aug. 14, 1956 |
| 2,791,772 | Cardani | May 14, 1957 |
| 2,827,630 | Kwasniewski | Mar. 25, 1958 |
| 2,829,371 | Sittner | Apr. 8, 1958 |
| 2,848,718 | Hancock | Aug. 26, 1958 |
| 2,856,998 | Hancock | Oct. 21, 1958 |